United States Patent
Juntunen et al.

(10) Patent No.: US 6,583,974 B1
(45) Date of Patent: Jun. 24, 2003

(54) CONTROL CIRCUIT FOR ELIMINATING A VOLTAGE AND CURRENT SPIKE

(75) Inventors: Asko Juntunen, Oulu (FI); Mika Niskanen, Tupos (FI)

(73) Assignee: IWS International Oy, Oulu (FI)

( * ) Notice: Subject to any disclaimer, the term of this patent is extended or adjusted under 35 U.S.C. 154(b) by 0 days.

(21) Appl. No.: 10/018,191

(22) PCT Filed: May 2, 2000

(86) PCT No.: PCT/FI00/00385

§ 371 (c)(1),
(2), (4) Date: Nov. 1, 2001

(87) PCT Pub. No.: WO00/69043

PCT Pub. Date: Nov. 16, 2000

(30) Foreign Application Priority Data

May 6, 1999 (FI) .................................................. 991042

(51) Int. Cl.[7] ................................................. H02H 3/20
(52) U.S. Cl. ....................................................... 361/91.1
(58) Field of Search ............................ 361/86, 87, 91.1, 361/93.1, 100

(56) References Cited

U.S. PATENT DOCUMENTS

| 4,390,812 A | 6/1983 | Seidler ........................ 315/200 |
| 4,570,108 A | 2/1986 | Stroede et al. ............... 315/360 |
| 4,891,728 A | 1/1990 | Preis et al. ..................... 361/18 |
| 5,436,786 A | 7/1995 | Pelly et al. .................... 361/56 |

FOREIGN PATENT DOCUMENTS

| EP | 0285417 | 10/1988 | ........... H05B/39/02 |

OTHER PUBLICATIONS

Application note to 514/1092 High Side Drivers, ST Microelectronics. (1999).
Application note to 524/0994 Drive circuits for power MOSFETs and IGBTs, ST Microelectronics, fig. 16 (1999).

*Primary Examiner*—Edward H. Tso
(74) *Attorney, Agent, or Firm*—Davidson, Davidson & Kappel, LLC

(57) ABSTRACT

The object of the invention is a control circuit for eliminating a voltage and current spike from a circuit formed by a switching transistor (T2) and a load (L). The base control of the switching transistor (T2) is arranged to be dependent on the voltage of the switching transistor's DRAIN (collector) which is forced, by means of the control circuit, to follow a predetermined desired value or wave form.

5 Claims, 3 Drawing Sheets

CONTROL CIRCUIT FOR ELIMINATING A VOLTAGE AND CURRENT SPIKE

FIELD OF THE INVENTION

Control circuit for eliminating a voltage and current spike

BACKGROUND OF THE INVENTION

The object of the invention is a control circuit for eliminating a voltage and current spike in a DC circuit, the control circuit being connected to control a solid state switch, such as a transistor (PNP or NPN) or a FET transistor (NMOS, PMOS) serially connected to a load, in such a way that when the load current is turned on, the switching current increases in a controlled manner without a detrimental voltage and current spike, the control circuit including at least one operational amplifier, or other combination of an amplifier and a comparator, which has a first and second control input and a control output, which has an effect on the base control of the solid state switch, and a matching network which is connected to the control circuit between the input terminal of the control signal and the base of the switching transistor in order to delay the ascending speed of the control signal, and correspondingly that of the load current and voltage, during turn-on of the load current.

This type of control circuit is disclosed, for example, in the patent publication EP-285417. This known circuit is suitable for eliminating current and voltage spikes during turn-on of the load, but it disregards the elimination of the current spike generated during the switching off of an inductive load.

Voltage and current spikes are mainly generated during the switching off of inductive and capacitive loads. The switching off of a coil or lamp may even generate a multiple voltage spike with respect to the input voltage, the spike destroying electronic structures and causing rapid aging of components, causing their service life to shorten markedly, and shortly rendering the entire apparatus useless. Furthermore, the EMC radiation emitted to the environment is extremely harmful and has a wide spectrum. To eliminate voltage spikes, external components (capacitors, inductances, resistors and diodes) are used. In many cases the momentarily discharging energy is so intense that it also ages the components used for protection, causing them to be damaged after a short period of use.

Both current spikes and voltage spikes become more intense if the load is located at the end of long cables, in which case the cable's inductance and capacitance enhance the effect of the current and voltage spikes. The external components are, in addition, powerful and cannot be integrated directly onto silicon at all. External components take up much space and are expensive.

SUMMARY OF THE INVENTION

The aim of the present invention is to develop a solution by means of which the effect of current and voltage spikes can be eliminated, both when turning on and switching off loads, by means of the type of control circuit in which no expensive components are required. The control circuit relating to the invention requires a small additional electronic circuit which is, however, moderately priced and can be integrated onto silicon, which means that its implementation is economical.

This aim of the invention is achieved on the basis of the characteristics described in the appended claim 1. Preferred embodiments of the invention are disclosed in the dependent claims.

BRIEF DESCRIPTION OF THE DRAWINGS

Some embodiments of the invention are described in greater detail in the following, with reference to the appended drawings, in which.

DETAILED DESCRIPTION OF THE EMBODIMENTS

Figure 1:
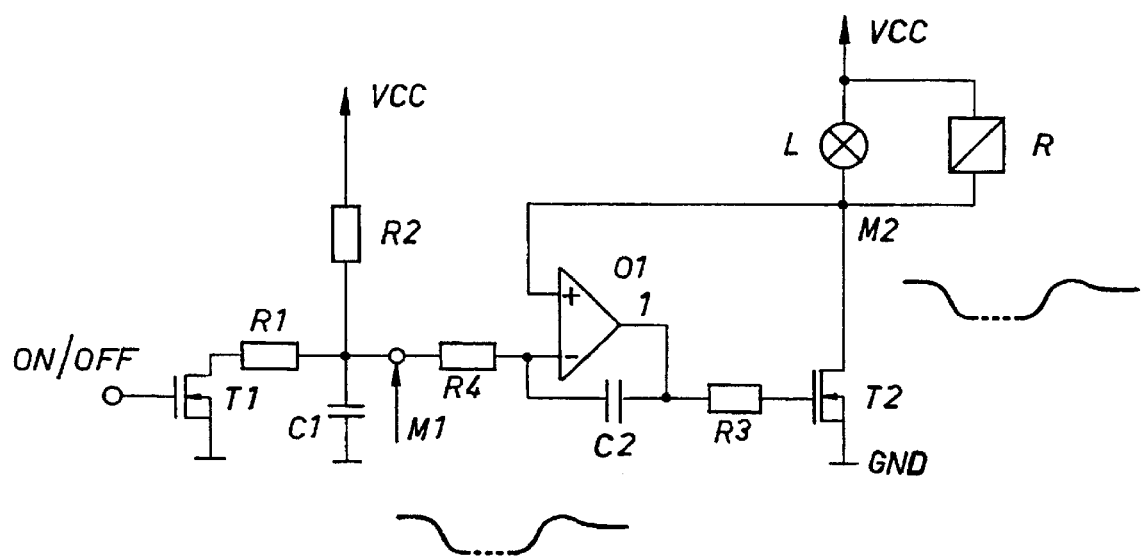
FIG. 1 shows a circuit diagram of a control circuit according to the first embodiment of the invention, which is a solution controlling the turning on or switching off of a load current on the basis of a desired value.
Figure 2:
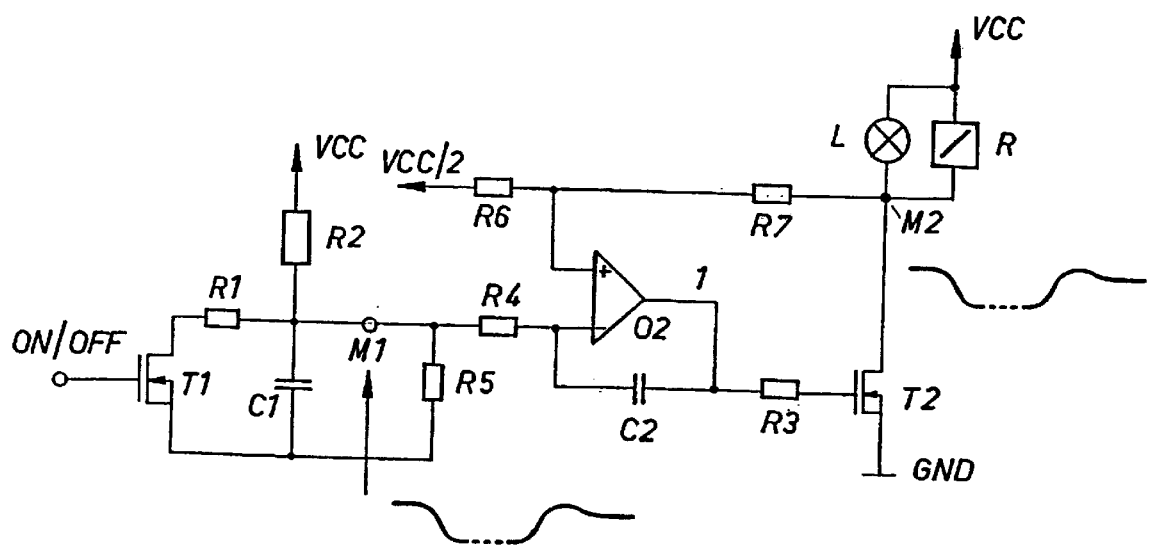
FIG. 2 shows a modified embodiment of FIG. 1, which is functionally identical with the control circuit of FIG. 1, but the operational amplifier O2 is not of the "rail to rail" type, which means that scaling resistors R5, R6 and R7 are required.

The embodiment shown in FIGS. 1 and 2 is first described. The point M2, that is, the DRAIN voltage of T2, is connected to the (+) input of operational amplifier O1 or O2. The connection shown "forces"point M2 to follow the wave form of M1. Point M2 is thus programmed in accordance with M1. Depending on the load, an appropriate wave form can be selected for point M1, which wave form is created by a separate matching network T1, R1, C1, R2. The desired wave form can, therefore, be determined for point M1 through the selection of components for the matching network. R4 and C2 form an integrator. T1 and T2 may be either ordinary transistors or FET transistors or also MOSFET transistors. In the embodiment shown in FIG. 1, operational amplifier O1 is a so-called "rail to rail" amplifier, which means that its input area extends from GND to VCC.

The turn-on can be carried out with a low gradient at point M2, for example, in the manner of a sine wave, that is, not by direct gradation. This prevents the high current spike generated by the cold wire of the lamp L from occurring. When the switching transistor T1 is switched off by means of OFF control, the voltage effective at point M1 determines, together with the dimensioning of the integrator components C2, R4, the switching-off control time and curve form of switching transistor T2. If the voltage at point M2 tends to differ from the voltage at point M1, the differentiating variable created will control operational amplifier O1, which controls switching transistor T2, thus compensating for the change created. During a voltage spike at point M2, transistor T2 remains open, whereby the voltage spike discharges to ground GND.

Figure 3:
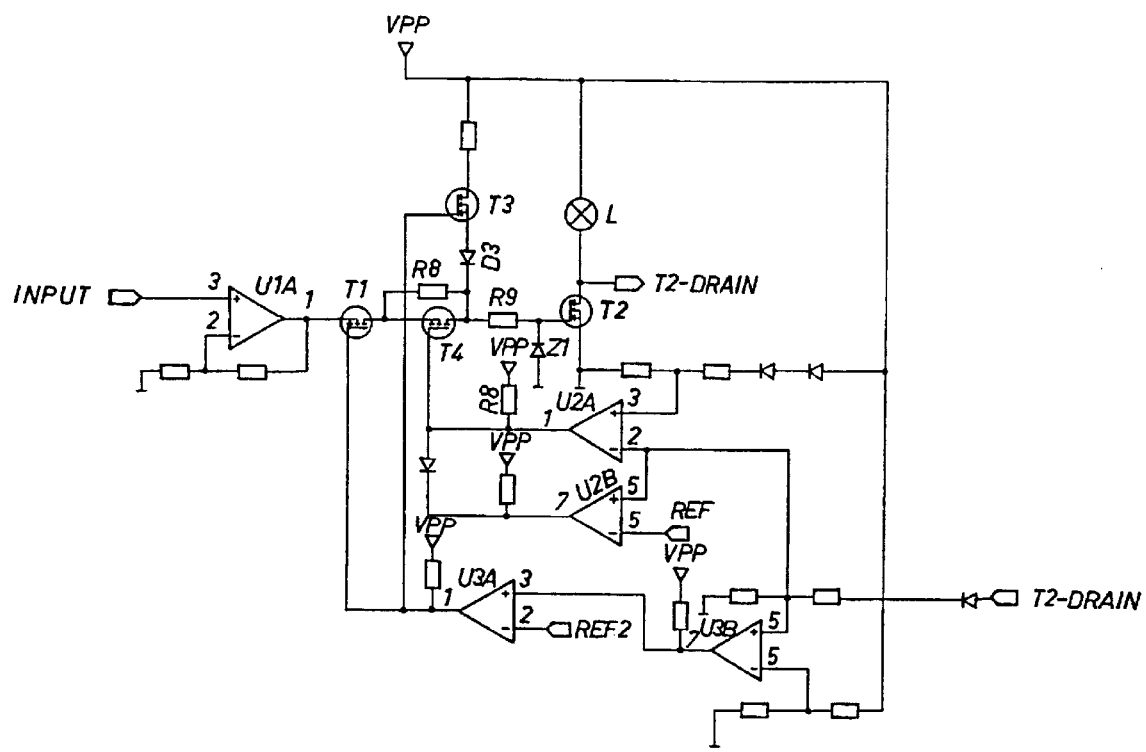
FIG. 3 shows a circuit diagram of the control circuit relating to the invention, which is a rapidly integrating solution realised by means of switches and comparators.

The embodiment shown in FIG. 3 is described in the following.

The turning on of the switching transistor, that is, the load current FET T2 takes place as follows.

Amplifier U1A raises the control (input) to the accumulator voltage level VPP, the FETs T1 and T2 are conductive, and FET T2 is turned on through resistor R9.

Current begins to flow through the lamp L and at the T2 DRAIN pin the voltage begins to decrease. This voltage is measured by comparator U2A. Once the voltage has decreased to VPP −1V, comparator U2A changes its state and switches off FET T4. The control voltage of the operating FET T2, therefore, now passes through the chain T1-RB-R9, thus forming a low-gradient rise in the control voltage. By means of this action, the current drawn by the lamp L is limited.

Once the switching transistor controlling the load L, that is, load current FET T2, is almost completely open, comparator U2B releases control to the normal state by opening FET T4.

The switching off of the switching transistor, or load current FET T2, takes place as follows.

The base voltage of FET T2 is discharged via the chain R9-T4-T1. The transient spikes typically occurring during the switching off of the current are measured by comparator U3B which acts as a differentiating amplifier. U3B, therefore, acts as a differentiating amplifier with the purpose of measuring the difference of voltage at T2 DRAIN/above the load L. Should the voltage at the T2 DRAIN pin increase above the accumulator voltage VPP prevailing above the load L, the comparator U3B will change its state, FET T1 will close and FET T3 open, driving the accumulator voltage directly to the base of switching transistor T2, via FET T3 and diode D3. The control voltage of switching transistor T2 is locked and thus the voltage spike is directed through switching transistor T2 to ground.

The voltage of the control circuit (e.g. at point M1 in FIGS. 1 and 2) may be modifiable, where necessary, also through programming in such a way that a processor (not shown) program selects various components or circuit alternatives or different reference voltage levels for use.

The invention is not limited to the above embodiments, but by using circuits functioning in a similar manner, a person skilled in the art may easily vary the implementing embodiments of the invention as guided by the disclosed embodiments. The essential aspect of the invention is that by means of the voltage at the DRAIN pin of the switching transistor T2, the control circuit according to the invention is also able to eliminate the voltage and current spikes generated while switching off a load, in addition to being able to slow down the turn-on of the current in the desired manner and, in a preferred embodiment of the invention, make it follow the desired wave form.

What is claimed is:

1. A control circuit for eliminating a voltage and current spike in a DC circuit, the control circuit being connected to control a solid state switch (T2), such as a transistor or a FET transistor, serially connected to a load, in such a way that when a current through the load (L) is turned on, the switching current increases in a controlled manner without a detrimental voltage and current spike, the control circuit including at least one operational amplifier (O1, O2), or other combination of an amplifier (U1A) and a comparator (U2A, U2B, U3B), which has a first and second control input (+, −) and a control output (1, 7), which has an effects on the base control of the solid state switch (T2), and a matching network (T1, R1, C1, R2 or U2A, T4, R8) which is connected to the control circuit between the input terminal (input; ON/OFF) of the control signal and the base of the switching transistor (T2) in order to delay the ascending speed of the control signal (input/ON), and correspondingly that of the load current and voltage, during turn-on of the load current, characterised in that the voltage of the DRAIN pin, or collector, of the solid state switch (T2), which is after the load (L) in direction of current flow from the positive terminal (VCC, VPP) of the power supply of the DC circuit, is connected to control the said operational amplifier (O1, O2) or the circuit means (U3B, T1) connected to the said matching network in such a way that in connection with the turn-off control (input/OFF) of the solid state switch (T2), the operational amplifier (O1, O2) and/or the matching network (T1, R1, C1, R2 or U3B, T1, T4) switches the control voltage to the base of the solid state switch (T2) in order to open the solid state switch (T2) at least partly if its DRAIN, or collector, voltage exceeds the voltage (VCC, VPP) of the power supply of the control circuit, or other higher predetermined voltage.

2. A control circuit as claimed in claim 1, characterised in that the DRAIN voltage of the solid state switch (T2) is connected to control the first input (+) of the said operational amplifier (O1, O2), the second input (−) being connected to the input terminal (ON/OFF) of the control signal of the solid state switch through the type of matching network (T1, R1, C1, R2) which creates, through the dimensioning of the components, a preselected wave form (M1) at one of the inputs of the operational amplifier (O1, O2) when the control signal is turned on (ON) or switched off (OFF), which means that the form of the output signal of the operational amplifier (O1, O2), and correspondingly the form (M2) of the signal effective at the DRAIN pin of the solid state switch (T2), are forced to follow the said wave form (M1).

3. A control circuit as claimed in claim 1 or 2, characterised in that the source pin or the solid state switch (T2) is connected to ground (GDN) and the DRAIN pin is connected through the load (L) to the terminal voltage (VCC, VPP) of the power supply.

4. A control circuit as claimed in any of the claims 1 to 3, characterised in that a capacitor (C2) is connected parallel with the operational amplifier (O1, O2), and between one of the pins (−) of the operational amplifier (O1, O2) and the matching network (T1, R1, C1, R2) is connected a resistor (R4) which, together with the said capacitor (C2) and operational amplifier (O1, O2) forms an integrator, the output of which is connected through a resistor (R3) to the base of the solid state switch (T2).

5. A control circuit as claimed in any of the claims 1 to 4, characterised in that the control circuit voltage can be changed through programming.

* * * * *